(12) United States Patent
Kászli

(10) Patent No.: US 10,660,215 B2
(45) Date of Patent: May 19, 2020

(54) STENCIL FRAMES

(71) Applicant: Péter Kászli, Budapest (HU)

(72) Inventor: Péter Kászli, Budapest (HU)

(73) Assignee: ALPHA ASSEMBLY SOLUTIONS INC., Somerset, NJ (US)

(*) Notice: Subject to any disclaimer, the term of this patent is extended or adjusted under 35 U.S.C. 154(b) by 0 days.

(21) Appl. No.: 15/518,285

(22) PCT Filed: Oct. 16, 2015

(86) PCT No.: PCT/EP2015/074046
§ 371 (c)(1),
(2) Date: Apr. 11, 2017

(87) PCT Pub. No.: WO2016/059227
PCT Pub. Date: Apr. 21, 2016

(65) Prior Publication Data
US 2017/0245371 A1    Aug. 24, 2017

(30) Foreign Application Priority Data

Oct. 18, 2014  (HU) .................................. 1400231 U

(51) Int. Cl.
B41F 15/36        (2006.01)
H05K 3/12         (2006.01)
(Continued)

(52) U.S. Cl.
CPC ......... *H05K 3/1225* (2013.01); *B23K 1/0016* (2013.01); *B23K 3/0623* (2013.01);
(Continued)

(58) Field of Classification Search
CPC ...... B41F 15/0881; B41F 15/36; B41F 15/08; B41F 15/0813; B41F 15/0845; B41F 15/34; H05K 3/1225
(Continued)

(56) References Cited

U.S. PATENT DOCUMENTS 5,076,162 A    12/1991  Goin
5,271,171 A *  12/1993  Smith ...................... D06C 3/08
                                                   101/127.1
(Continued)

FOREIGN PATENT DOCUMENTS

DE        3043666      7/1982
EP        1 982 834    10/2008
(Continued)

*Primary Examiner* — Leslie J Evanisko
(74) *Attorney, Agent, or Firm* — Carmody Torrance Sandak & Hennessey LLP

(57) ABSTRACT

Stencil frames for tensioning stencils of an angular shape are provided. The stencil frame comprises corner elements (2), edge elements (1), fastening elements (13) and tensioning devices with a tensioning device being associated with each edge element (1). The corner elements (2) each have two, mutually perpendicular, guiding profiles (12) which joined at an intersection of their axes and the edge elements (1) each have a uniaxial reception profile (11). Each reception profile (11) is connectable to two guiding profiles (12) by loose fit. Each tensioning device has at least one elastic element (5) and connects between two neighbouring corner elements (2). A line of force exerted by each tensioning device is parallel to the axis of its corresponding reception profile (11).

26 Claims, 15 Drawing Sheets

(51) Int. Cl.
*B41F 15/08* (2006.01)
*B23K 1/00* (2006.01)
*B23K 3/06* (2006.01)
*H05K 3/34* (2006.01)

(52) U.S. Cl.
CPC ........ *B23K 3/0638* (2013.01); *B41F 15/0881* (2013.01); *B41F 15/36* (2013.01); *H05K 3/3484* (2013.01); *B41P 2215/12* (2013.01)

(58) Field of Classification Search
USPC .................................. 101/127, 127.1, 128.1
See application file for complete search history.

(56) References Cited

U.S. PATENT DOCUMENTS

| | | |
|---|---|---|
| 7,644,526 B2 | 1/2010 | Kasuya |
| 8,342,089 B2 | 1/2013 | Cane et al. |
| 2005/0034614 A1 | 2/2005 | Kasuya |
| 2009/0031593 A1* | 2/2009 | Kasuya .................. B41F 15/36 38/102.3 |
| 2010/0307353 A1 | 12/2010 | Willshere |

FOREIGN PATENT DOCUMENTS

| | | |
|---|---|---|
| EP | 2205441 B1 | 3/2019 |
| GB | 2317366 | 3/1998 |
| JP | 2009525894 | 7/2009 |
| KR | 10-2008-0110580 | 12/2008 |
| WO | 2007/091630 | 8/2007 |
| WO | 2009047012 | 4/2009 |
| WO | 2013061438 | 5/2013 |

\* cited by examiner

STENCIL FRAMES

TECHNICAL FIELD

This disclosure relates to stencil frames for uniform tensioning of stencil foils. The stencil frames may allow a stencil foil to be releasably mounted to the stencil frame. The stencil frames may be used for solder paste application onto a circuit substrate during surface-mount device (SMD) circuit production.

BACKGROUND

The most widespread bonding technology used in the electronics industry is the so-called reflow soldering. The appearance of solder in this technology is solder paste that is a solvent suspension of solder alloy and flux. In mass production solder paste is first applied to the surface of the assembly board (usually woven glass fabric reinforced epoxy resin) or other circuit substrate through a thin metal fixture commonly referred to as a stencil or stencil foil. The stencil foil is a machined metal tool, typically in the form of a sheet, with openings (apertures) on it matching the contact surfaces of the assembly board. During printing a creamy solder paste is smeared onto the assembly board though the openings of the stencil foil so that the solder paste is applied to the assembly board only at the location of these openings. Components are then placed on the assembly board in contact with the solder paste which provides a temporary means of attachment of the components to the assembly board. Soft soldered bonds are then created by application of heat to the solder paste to melt the solder paste which is then allowed to cool to form a soldered bond between the components and the assembly board.

It is important during printing of the solder paste that the stencil foil is uniformly tensioned above the assembly board. Non-uniform tensioning of the stencil foil, as well as any protrusions from the assembly board, can cause a solder paste volume different from the desired volume being applied to the assembly board which can result in shifting of components or short circuits between component leads which may be designed only with small pitch separations. Any level difference on the assembly board, for example, conductive paths covered with solder mask or self-adhesive markers, can also lead to non-contact situations. If these level differences are not too big or necessarily far from the soldering surfaces then the stencil foil may still contact the assembly board and the printed volume may be as designed.

Two typical soldering defects which may occur are 'solder bridges' between component leads producing an unwanted contact point and 'skips' where electric and/or mechanical contact between the component and the assembly board is not adequately formed. Solder bridges form when an excess amount of solder paste is deposited on the assembly board and skips form when an insufficient amount of solder paste is present.

In the electronic industry stencil foils are used in numbers of hundreds of thousands annually worldwide. Typically all high volume produced electronic circuits have such tools associated with them. As these must be stored through the full lifetime of the circuits they take up huge volumes in electronics manufacturing facilities. To facilitate storage many companies have developed modular solutions that have either stencil foils with openings or narrow sub-frames along the edges to mount the stencil foils into tensioning frames. DE3043666A1 in the name of Messerschmitt shows a solution in which the tension of the frame can be tuned accurately by use of many horizontal and vertical adjusting screws. However, the adjustment operation is burdensome and slow. More practical solutions are provided by frames which can use pneumatic force to release quickly springs arranged around the edges wherein the springs hold the stencil tensioned when there is a lack of pneumatic force applied. Examples of this solution are the frame systems described in GB2317366A in the name of Alpha Fry Limited, WO2013061438A1 in the name of Meiko Electronics Co Ltd and WO2009047012A2 in the name of Dek International GmbH. Despite unquestioned utility of those systems a significant drawback is that they need large numbers of complex shaped, typically metal, components with a requirement for tight manufacturing tolerances leading to a manufacturing cost which is high and the resulting frames may be prone to defects.

SUMMARY OF THE DISCLOSURE

Against this background the present disclosure provides a stencil frame as set out in the appended claims. An assembly comprising a stencil frame and a stencil is also provided as set out in the appended claims.

The proposed solution is based on the realisation that a stencil frame can be decomposed into corner elements and edge elements that can be moved relative to one other and pre-tensioned by springs. The corner elements and/or the edge elements may optionally be created by rectangular and patterned extruded profiles much more cheaply than pneumatically-released frames.

Consequently, the stencil frame of the present disclosure comprises corner elements, edge elements, fastening elements and tensioning devices with a tensioning device being associated with each edge element. The corner elements each have two, mutually perpendicular guiding profiles with those two guiding profiles being joined at an intersection of their axes. The edge elements each have a uniaxial reception profile, each reception profile being connectable to two guiding profiles by loose fit. Each tensioning device has at least one elastic element. Each tensioning device connects between two neighbouring corner elements and, optionally, each tensioning device is connected to one edge element. A line of force or effect exerted by each tensioning device is parallel to the axis of its corresponding reception profile, and optionally the line of force or effect exerted by each tensioning device is uniaxial with the axis of its corresponding reception profile.

The stencil frame may preferably be suitable for tensioning stencils that have a rectangular or square shape in plan view.

The two guiding profiles of each corner element may have the same length as each other.

The length of each guiding profile used may be varied dependent on the type (and length) of tensioning device provided. For example, each guiding profile may have a length of 10% to 45% of the length of the edge element in which it is received. A shorter length of guiding profile, for example a length of 10% to 25% of the length of the edge element in which it is received, may be preferred to reduce the weight and material cost of the stencil frame.

The overall size of the stencil frame may be adjusted to suit the size of stencil to be tensioned. For the example of a stencil frame of tensioned size 585×585×39 mm (L×W×D)—where 'tensioned size' is the size when in use with a stencil coupled to the fastening elements—the weight of the stencil frame is preferably under 3000 g. For the example of a stencil frame of tensioned size 585×737×39 mm the weight of the stencil frame is preferably under 3500 g. For the example of a stencil frame of tensioned size 737×737×39 mm the weight of the stencil frame is preferably under 4000 g.

The two guiding profiles of each corner element may be joined at the intersection of their axes by forming the two guiding profiles integrally, for example by casting them as a single unit. Alternatively, the guiding profiles may be formed separately from one another and then joined together. For example, the guiding profiles may be bolted together.

The guiding profiles may be directly coupled to one another at their intersection. Alternatively, a corner unit may be provided in between the two guiding profiles so that they are indirectly coupled together. In such a case each guiding profile may be coupled to the corner unit, for example by bolting.

The reception profile of each edge element may be connected to two guiding profiles by receiving one guiding profile in each end of the reception profile.

The reception profile may be connected to the guiding profile simply by the sliding insertion of the guiding profile within the reception profile of the edge element. There is no requirement for an additional physical interconnection element extending between the guiding profile and the reception profile. However, it is preferred to provide an interconnection element extending between each guiding profile and the reception profile in which it is received so as to prevent the guiding profiles being fully displaced from the reception profile when a stencil is not coupled to the stencil frame and the stencil frame is at rest without any external forces being applied. In other words, the interconnection elements prevent the complete disconnection of the corner elements from the edge elements which would lead to falling apart of the stencil frame.

The interconnection element may take many forms but it is necessary for it to allow a limited degree of relative sliding movement between the guiding profile and the reception profile while preventing complete withdrawal of the guiding profile from the reception profile. In one example, the interconnection element comprises a locking pin that projects from the guiding profile and is received in an elongate slot formed in the reception profile. The locking pin is able to move within the confines of the elongate slot allowing a limited degree of relative movement between the guiding profile and the reception profile. The location and length of the elongate slots may preferably be chosen so that the maximum dimension of the stencil frame (length and/or width) is accompanied with the locking pins locked in abutment against one end of its associated elongate slot with the only a small residual elastic force being imparted to the corner elements by the tensioning device. The length of the elongate slots must be long enough to allow the corner elements to be squeezed towards each other to reduce the dimension of the stencil frame (length and/or width) sufficiently to allow for coupling of the stencil to the fastening elements.

Alternatively, the locking pin may project from the reception profile and be received in an elongate slot formed in the guiding profile.

The guiding profile has a loose fit in the reception profile. This allows easier relative movement. It is advantageous to reduce the degree of friction between the guiding profile and the reception profile. A low friction material or coating may be applied to one or other or both of the guiding profile and reception profile. Examples of possible materials include PTFE and acetal resin.

The reception profiles and guiding profiles, while a loose fit with each other, may have cross-sectional shapes which key with each other to prevent or limit relative rotation of the guiding profile and the reception profile about the axis of the reception profile. Thus, relative movement may be constrained to be sliding movement only along the line of the axis of the reception profile. In one example the external cross-sectional shape of the guiding profile may generally, or wholly, match the internal cross-sectional shape of the reception profile while the external dimensions of the guiding profile may be less than the internal dimension of the reception profile to ensure the required loose fit.

It may be beneficial if the guiding profiles and/or the reception profiles are made of square tubes. Square tubes and other forms of closed box section may be advantageous in providing greater rigidity of the guiding profiles and/or the reception profiles. The greater rigidity may allow for lighter guiding profiles and/or reception profiles to be used. The greater rigidity may also be beneficial in allowing the stencil frame to impart higher tensions to the stencil in use that would not be possible with prior art stencil frames that are less rigid. For example, stencil frames of the present disclosure may withstand tensions of up to 120 N/cm without being overloaded.

In addition, the design of the stencil frame of the present disclosure may do away with the need to provide any pneumatic device or mechanical gearing within the interior of the edge elements, both of which would need in use to be functionally connected to components outside the edge element to be actuated. By contrast, the biasing means of the present disclosure may be fully self-contained within the interior of the edge elements and may be self-actuated in that they do not rely on actuation by an external actuation device to tension a coupled stencil frame. Thus, use of a box structure for the guiding profiles and in particular the reception profiles is made possible since there is no essential requirement to access the interior of the profiles during use.

Each edge element may comprise one tensioning device.

Each tensioning device may have one or more elastic elements. Each elastic element may be, or may comprise, a spring. The spring may be a compression spring.

The springs may be located so that when the stencil frame is not tensioned (i.e. when the frame is not in a loading station or no stencil is coupled to the fastening elements) the force exerted by the springs is almost zero.

The springs may have a force rating of 300-500 N/mm and the total stroke of the springs may be defined so that with a stencil loaded and coupled to the fastening elements the total force is sufficient for the needed tension in the stencil (typically 50 N/cm or greater along each edge).

The springs may be single springs or dual springs (where a larger diameter spring is placed over a smaller diameter spring concentrically, embedding the smaller spring by the larger).

Each tensioning device is associated with an edge element. The tensioning device may be associated with the edge element by being coupled to the edge element. The tensioning device may be associated with the edge element by being provided within an interior of the edge element.

Each tensioning device connects between two neighbouring corner elements. It is not essential that the tensioning device is attached or coupled to the corner elements. For example, the tensioning device may simply abut against and push against the guiding profiles of the corner elements. However, if desired, the tensioning device may comprise components that are attached or coupled to the guiding profiles and/or guide the elastic elements into engagement with the guiding profiles.

Optionally each tensioning device is connected to the edge element in which it is received. The tensioning device may be connected to the edge element by a centering element extending between the tensioning device and the edge element in which it is received. The centering element may be a centering pin. The centering pin may help to locate and fix the tensioning element to the middle of the length of the edge element. Advantageously, this may help to ensure that the edge element remains centred during use relative to the neighbouring corner elements and/or the tensioning device which may help in providing a predictable and uniform tension to the stencil in use.

The line of force or effect exerted by each tensioning device is parallel, preferably uniaxial, to the axis of its corresponding reception profile. The axis of the reception profile is preferably also the axis of the edge element comprising the reception profile.

Each tensioning device may comprise one or more components which act singularly or in combination to strive to push neighbouring corner elements apart.

Examples of tensioning devices of the present disclosure will now be summarised.

In a first example of tensioning device the elastic element may simply comprise a spring which extends between the two guiding profiles which are slidingly received in the reception profile. In this case, preferably the reception profile (in which the tensioning device is seated) guides from outside the spring to retain the alignment and general location of the spring relative to the reception profile.

In a variant of the first example, the spring may optionally be guided not by, or at least not only by, the reception profile but by linear guidance elements that may be attached axially to, or inserted within, or protrude from the ends of the respective guiding profiles. The linear guidance elements may have a variety of cross-sectional shapes and are preferably prismatic along their length. The linear guidance elements may each be a single piece or may have a telescopic profile. For example, the tensioning device may comprise a spring which is guided by two linear guidance elements that are attached axially to the ends of the guiding profiles.

A second example of tensioning device comprises an elastic element, preferably a tensioning spring, and at least a guiding pin. Each guiding profile may have an axial hole on their end in which the guiding pin is loosely fitted. The elastic element sits on the guiding pin and biases the neighbouring corner elements apart. Optionally, one guiding pin is provided in each tensioning device which extends between the axial holes. Preferably, each guiding pin may be connected to the reception profile in which it is received. For example, by use of a perpendicular fixing pin or screw that is fixed to the edge element forming the reception profile. Advantageously, this may help keep the elastic element and the guiding pin in a central position.

A third example of tensioning device which may be beneficial comprises at least of a tensioning spring, one threaded shaft, one threaded nut and a rotatable setting wheel fixed to the threaded shaft. At least one of the connected corner elements has an axial hole at the end of the guiding profile in which the threaded shaft is fitted loosely. The tensioning springs are mounted on the threaded shaft between the guiding profiles and the threaded nuts. The threaded nuts have a loose fit against the inner wall of the edge elements and the rotation of the threaded nuts around the threaded shafts is prevented by a keyed connection. The edge elements may have at least one opening beside the rotatable setting wheels. If the threaded shaft has two threaded nuts connected to it, one side of the threaded shaft has an oppositely-directed thread.

A fourth example of tensioning device which may be beneficial comprises a spacer element and at least two elastic elements which are preferably springs. The use of the spacer element allows the springs to be located apart from one another nearer the corners of the stencil frame. Consequently shorter guiding profiles of the corner elements and shorter elastic elements can be used which saves material and helps to reduce the weight of the stencil frame. The two elastic elements are coupled to either end of the spacer element, preferably by stringing the elastic elements over the ends of the spacer element. The spacer element may function to transfer the force or effect of each elastic element to the other end of the tensioning device. Relatively short elastic elements can be utilised and the spacer element, which is preferably inelastic, takes up the remainder of the length of the tensioning device. In this way, a tensioning device comprising a spacer element and two coupled elastic elements can function over a much greater length than would be possible using a continuous elastic element, such as a spring.

The spacer element may be a spacer bar. The spacer bar may have a solid section or may have a tubular sectional shape which may be circular or other shape such as star or cross shaped. The spacer bar may comprise an enlarged diameter central section and two narrowed diameter sections, one at each end. The elastic elements in the form of springs maybe strung over each narrowed diameter section and abut against the enlarged diameter central section, preferably with interposed washers.

The length of the enlarged diameter central section of the spacer bar can be used to adjust and predefine the tension the stencil frame can exert in use. The longer the enlarged diameter central section is, the higher the tension becomes due to the springs being more compressed and therefore having a higher pre-tension.

Preferably, each spacer element may be connected to the reception profile in which it is received. For example, by use of a perpendicular fixing pin or screw that is fixed to the edge element forming the reception profile. Advantageously, this may help keep the spacer element in a central position.

In any of the tensioning devices of the present disclosure, force distribution components, for example, washers, may be provided between the elastic element and the component being biased by the elastic element.

Each edge element may comprise at least one fastening element which may allow coupling of the stencil, in use, to the edge element. The fastening element may be a series of pins or splines aligned perpendicular to the edge element or a clamping rim alongside the edge element or a profile bent back or a perpendicular shoulder along the edge element. The fastening element may be integrally formed with the edge element, for example as part of the same casting or extrusion.

The stencil frame may be manufactured from suitable materials having the necessary strength and material characteristics for their function. Preferably, the corner elements may be formed from cast and/or extruded aluminium. Preferably, the edge elements may be formed from extruded aluminium. Preferably, components of the tensioning devices and sundry components, e.g. centering pins, locking pins, nuts etc. may be formed from stainless steel.

BRIEF DESCRIPTION OF THE DRAWINGS

The present disclosure will now be described, by way of example only, with reference to the accompanying drawings in which.

DETAILED DESCRIPTION

Figure 1:
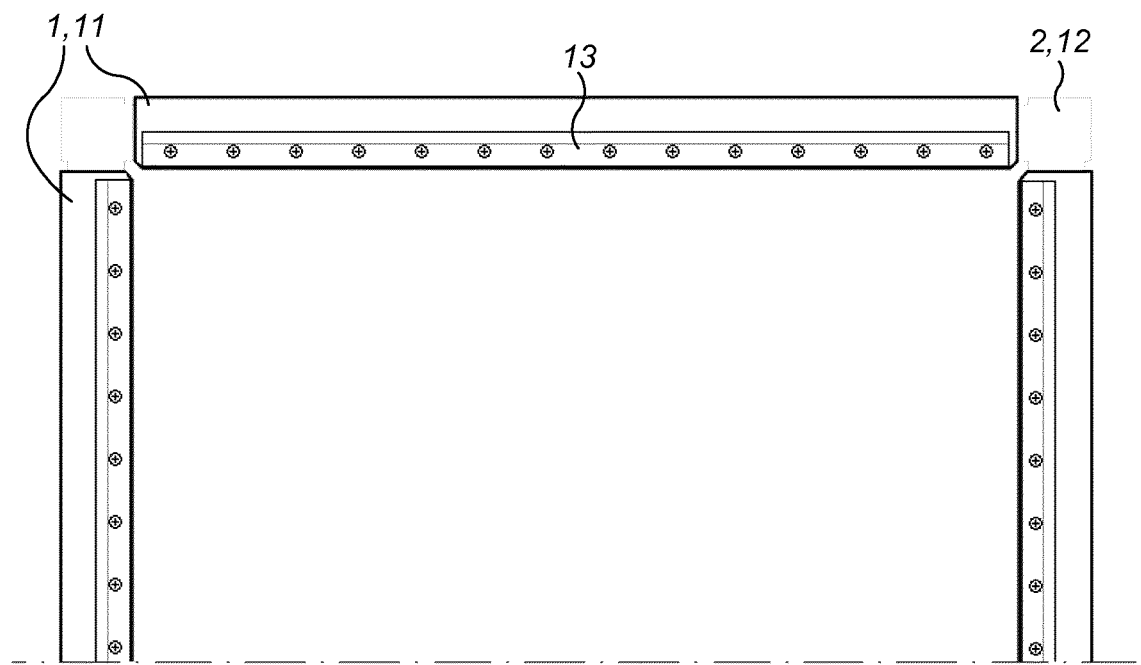
FIG. 1: top schematic view illustrating the general form of a tensioning frame according to the present disclosure.

Looking at FIG. 1 we can recognise the general frame structure where the fastening element 13 is actually a bent metal strip assembled with screws and which can anchor the edge element of a stencil foil. Instead of the fastening element 13 the frame can be anchored to the stencil foil by other known methods like edge clamping or pins, screws or splines perpendicular to edge element 1 and that can attach to openings made alongside the edge of the stencil foil. The fastening element 13 can furthermore be a shoulder perpendicular to the plane of the stencil that is also bound to the edge elements 1. The tensioning frame tensions the stencil foil so, that the corner elements 2 connect with the edge elements 1 in an axial direction of the corner elements 2 and can move relatively to each-other. Between the aforementioned parts tensioning devices are mounted that strive to separate from each-other the opposed edge elements 1. The corner elements 2 define the relative angle of the edge elements 1 which practically can be square but also higher edge numbers could be imagined.

The corner elements 2 have guiding profiles 12 that connect with the edge elements 1. There are two mutually perpendicular guiding profiles 12 and their axes intersect and are either joined directly or by a corner joint. The connecting part of the edge element 1 is shaped as a reception profile 11 to connect with the guiding profile 12. In a beneficial solution the edge element 1 can act as a reception profile 11 along its full length thus the whole part can be a square tube and the corner element 2 can also act as a guiding profile 12 along its full length and be made of a square tube too.

Figure 2:
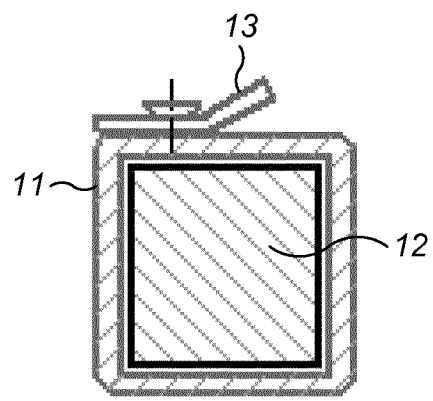
FIG. 2: cross sectional schematic view of the tensioning frame of FIG. 1.

FIG. 2 shows in a sectional side view one side of the stencil frame. As easy manufacturability is the goal the reception profile 11 is a square tube (steel, aluminium or fibre reinforced plastic), while the guiding profile 12 can still be a square tube or solid block. The guiding profile 12 and the reception profile 11 act as a linear guide and that function can be executed by several other profile pairs and further to that more, or not continuous cross section elements can be used for one or both profiles. The fastening element 13 can be in the simplest case a metal ribbon bent in 30-60 degrees and attached by screws to the edge element 1.

Figure 3:
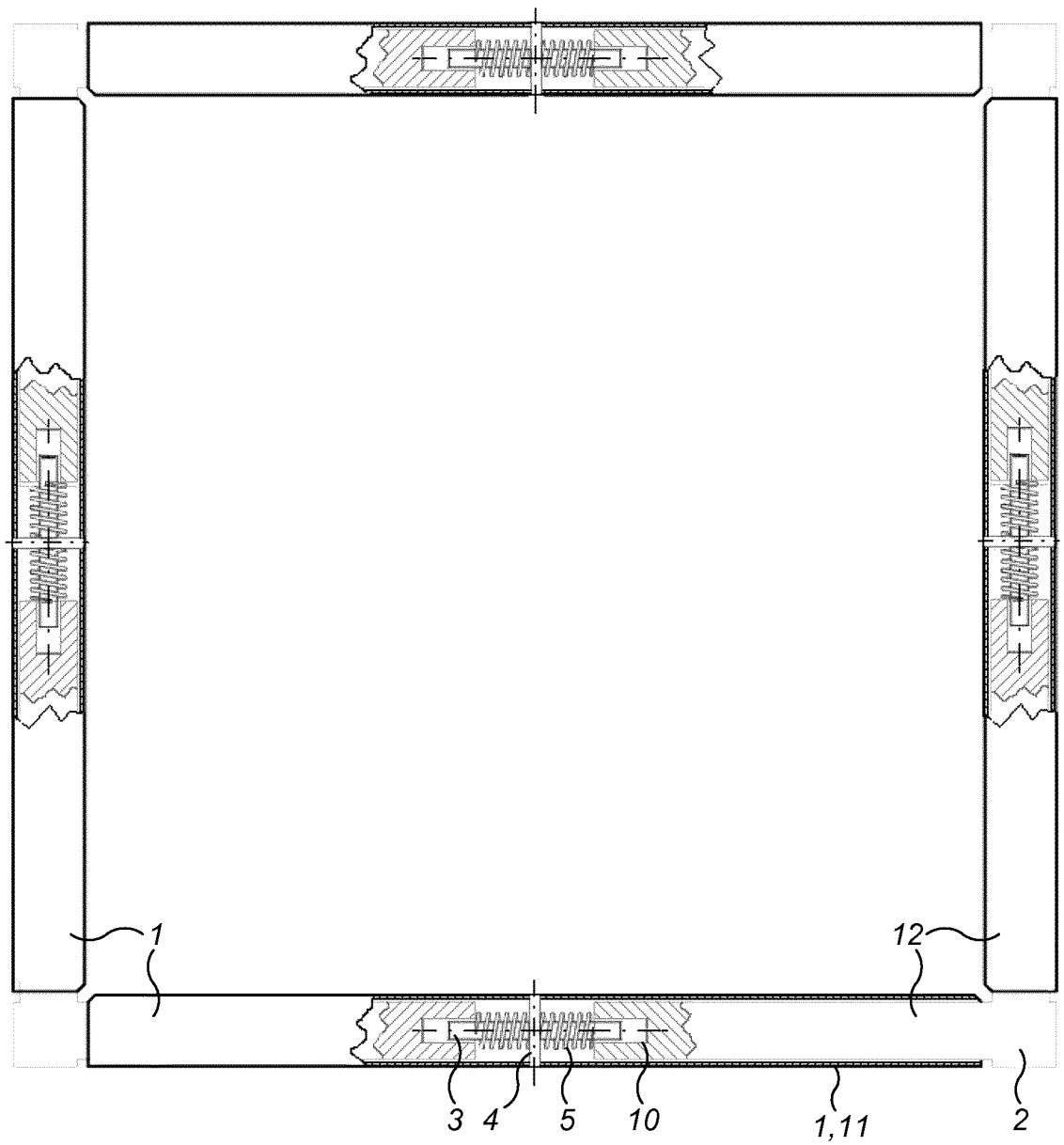
FIG. 3: bottom schematic view of a tensioning frame according to the present disclosure comprising a tensioning device.

In FIG. 3 we can see one simple version of the tensioning device. The direction of the four reception profiles 11 and therefore the plane of the stencil is defined by the guiding profiles 12 of the corner elements 2. Along the guiding profiles 12 the reception profiles 11 can be shifted. The reception profiles 11 are uniaxial but in optimum case the two are made from the same workpiece and is made of a rectangular tube. The guiding profiles 12 are prisms with axial holes 10 on their end. The hole 10 is connected with a guiding pin 3 on which sits at least one elastic part e.g. a spring 5. To keep the spring 5 and the guiding pin 3 in a central position there is a fixing pin 4 (or fixing screw) that is connected with the guiding pin 3, practically with a through hole. The fixing pin 4 (or fixing screw) passes through a hole on the side of the edge element 1. The holes 10 and the guiding pin 3 have to be loose fitted for the arrangement depicted in the figure. The release of the tension of the frame can be done by pressing the two edge elements 1 against each-other and by this we release the tension against the fastening elements 13. The tensioning devices can easily be hidden in the inside of the edge elements 1.

FIGS. 4 to 8 show a stencil frame of the general type illustrated in FIG. 3 with modifications allowing more beneficial manufacturability and use. The general working principal is the same as for the stencil frame of FIG. 3. Like reference numerals have been used for like parts.

Figure 4:
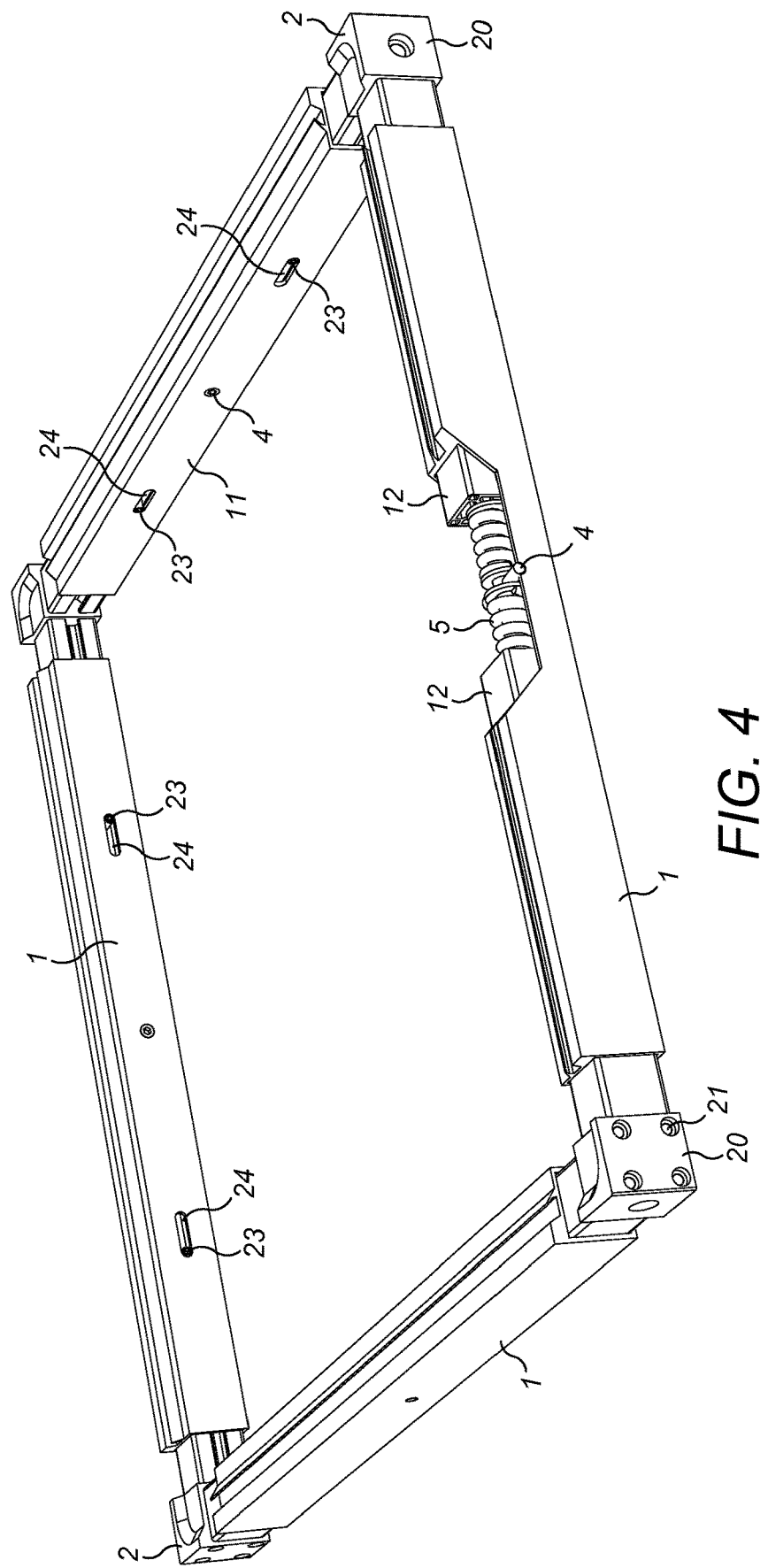
FIG. 4: perspective part-sectioned view of a tensioning frame of the general type illustrated in FIG. 3 with modifications.

In FIG. 4 one of the edge elements 1 is shown partly sectioned to allow the tensioning device to be seen.

Figure 5:
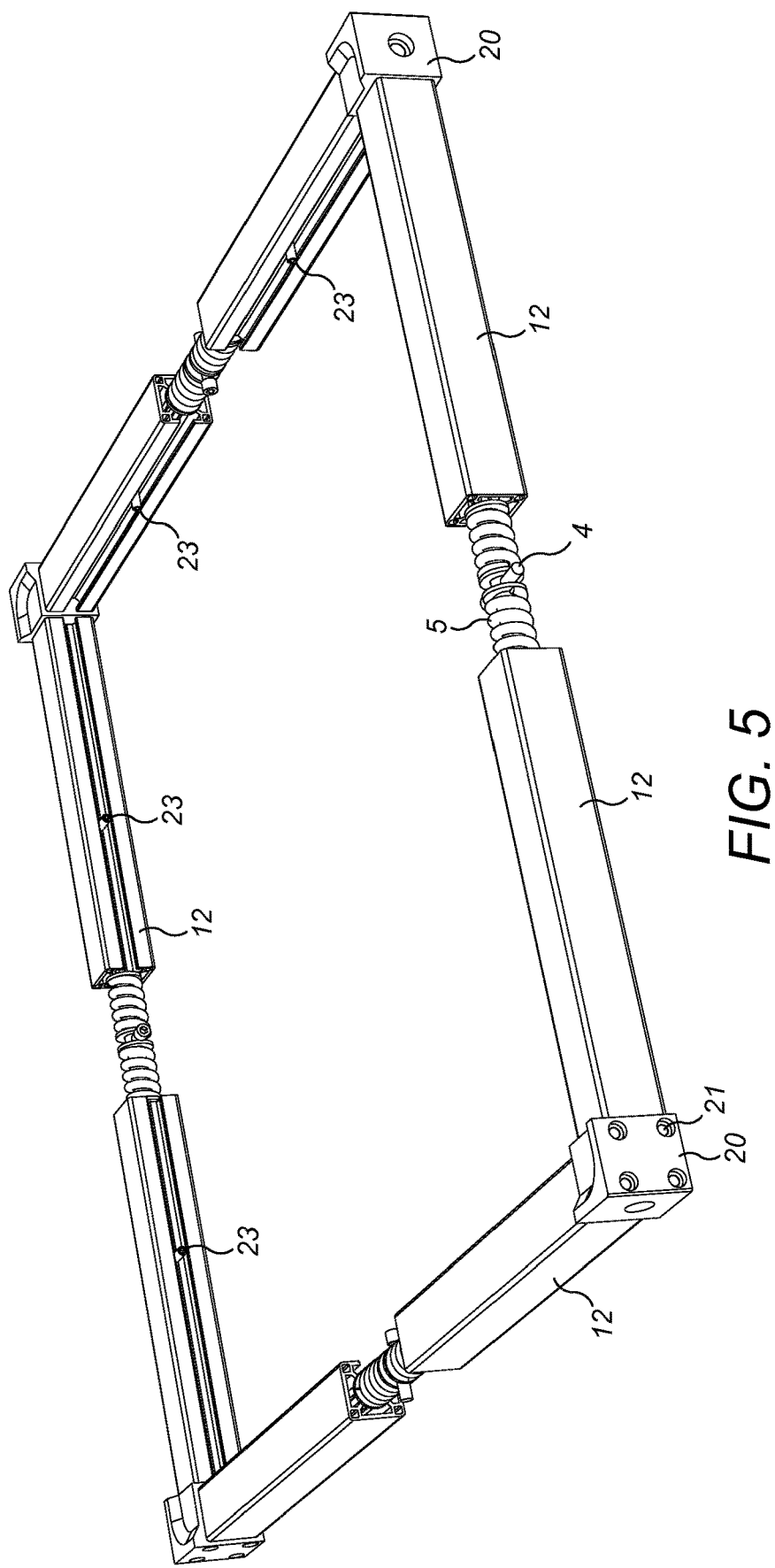
FIG. 5: perspective view of the tensioning frame of FIG. 4 with certain parts omitted for clarity.

In FIG. 5 the edge elements 1 have been omitted to allow the guiding profiles 12 to be seen more clearly.

Figure 6:
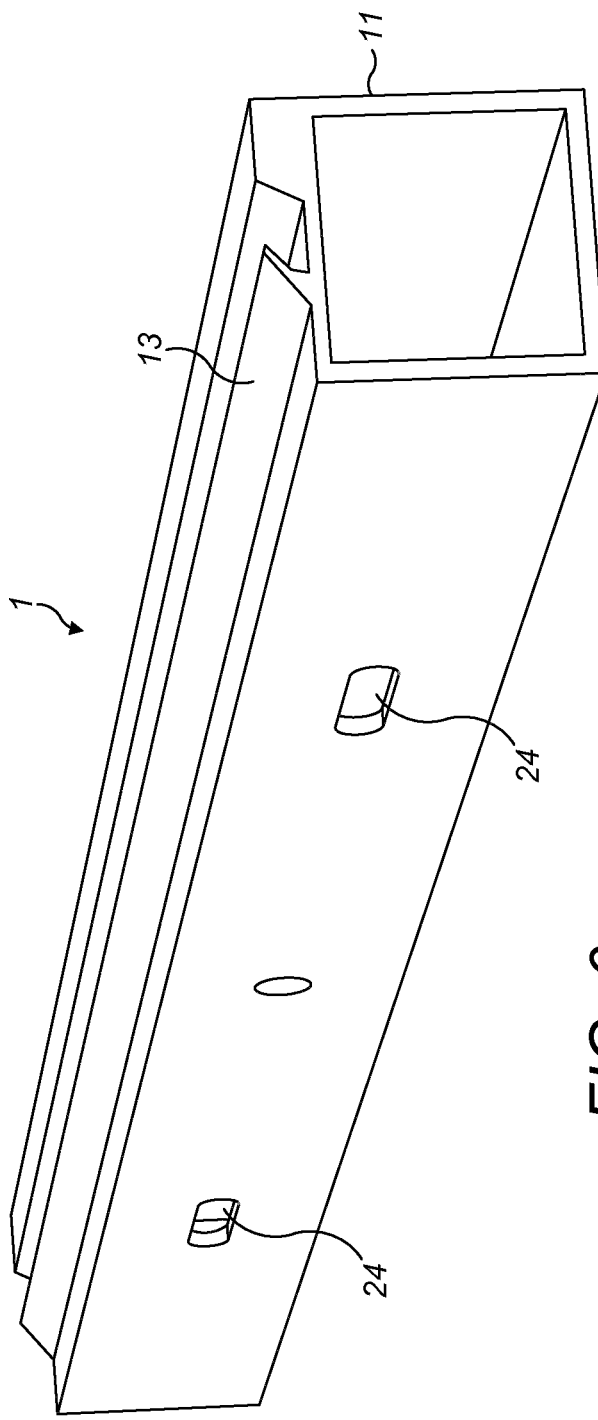
FIG. 6: perspective view illustrating a reception profile of the tensioning frame of FIG. 4.

FIG. 6 illustrates the edge element 1 in isolation showing how the reception profile 11 may have the form of a closed box section—in this example a square tube. The fastening element 13 may be integrally formed in the same extrusion as a profile bent back.

Figure 7:
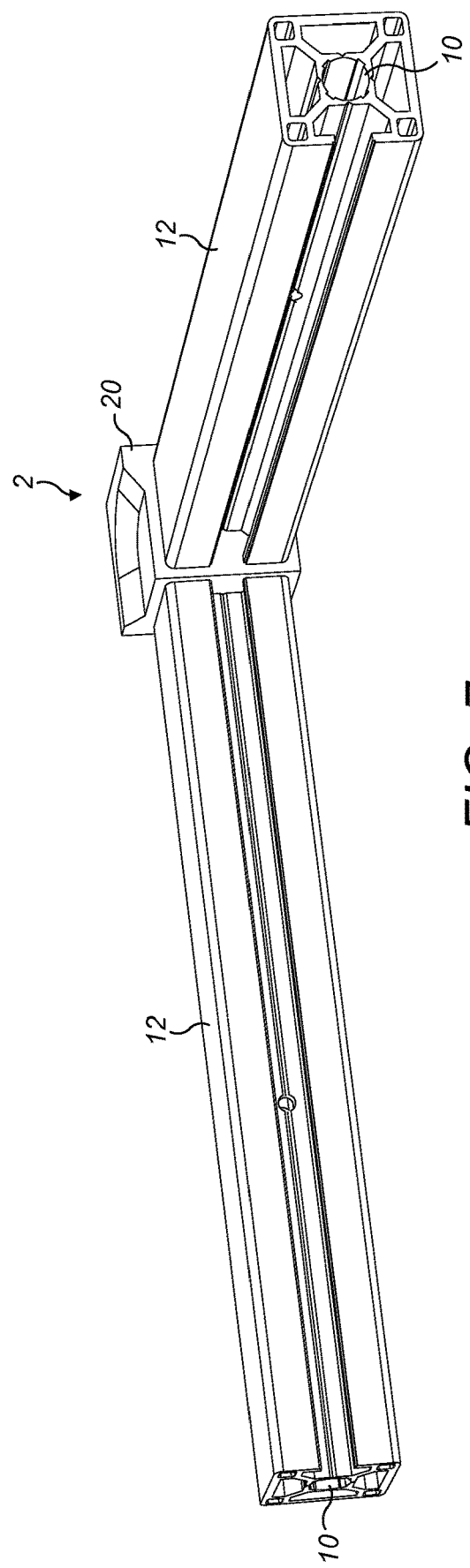
FIG. 7: perspective view illustrating parts of a corner element of the tensioning frame of FIG. 4.
Figure 11:
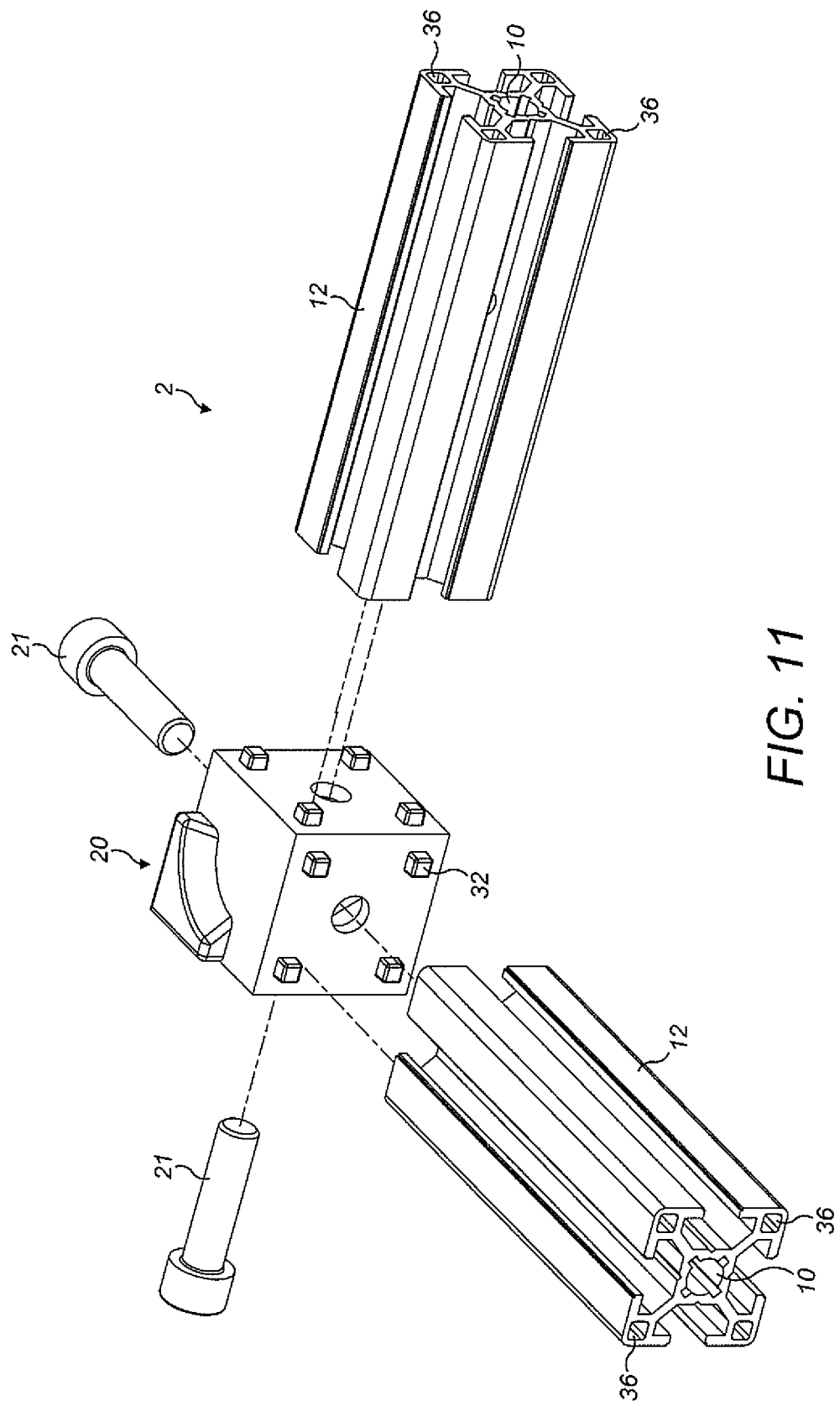
FIG. 11: exploded perspective view illustrating a modified corner element for use in tensioning frames of the present disclosure.
Figure 18:
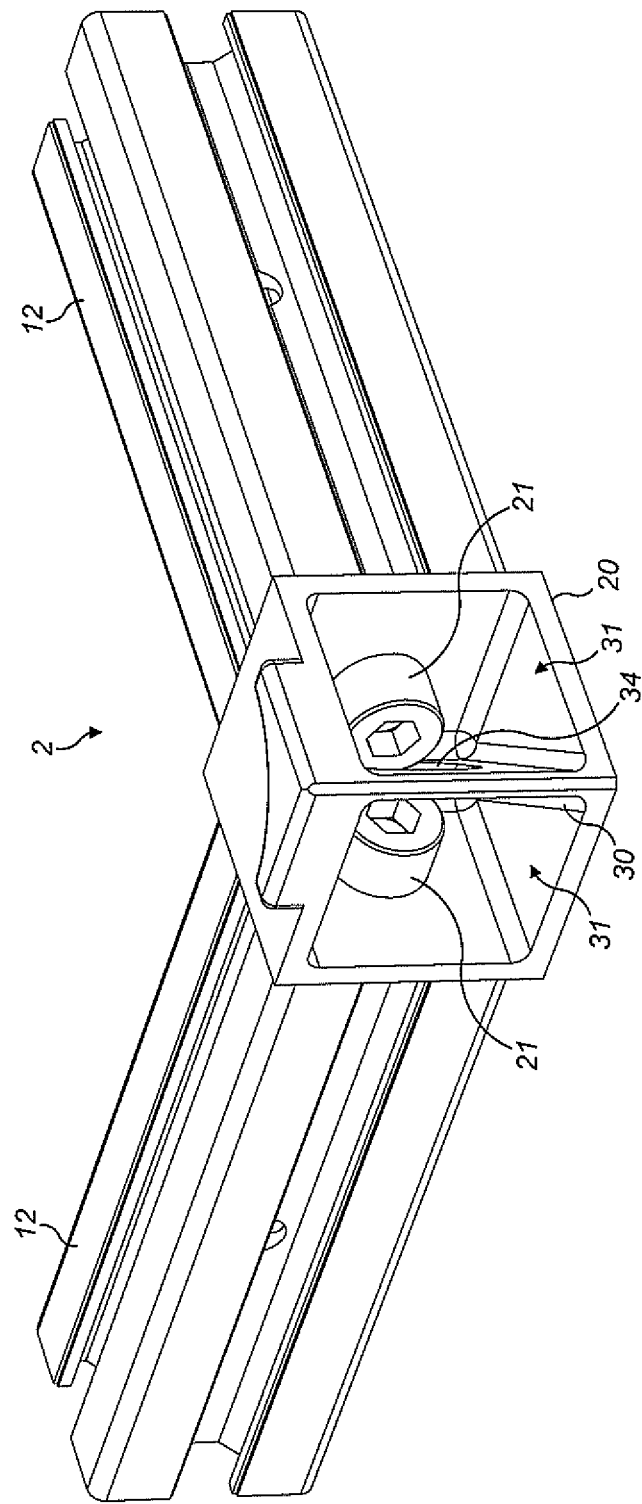
FIG. 18: perspective view illustrating a corner element of the tensioning frame of FIG. 15.

FIG. 7 illustrates a corner element 2 in isolation showing how the guiding profiles 12 are joined together indirectly via a corner joint in the form of a corner unit 20. The guiding profiles 12 may be coupled to the corner unit 20 by bolts 21 that are received in threaded holes formed in the proximal ends of the guiding profiles 12. A variant form of the corner unit 20 is shown in FIGS. 11 and 18 which may be used with any of the stencil frames of the present disclosure. In this variant the corner unit 20 may have a generally cuboid shape with a dividing web 30 provided which extends from an innermost corner of the corner unit outwards to the outmost corner. The dividing web 30 allows for the corner unit 20 to define two openings 31 into an interior of the corner unit 20. The dividing web 30 is provided with a window 34 to allow tool access to the bolts 21 for coupling and uncoupling of the guiding profiles 12. A tool such as an Allen key can enter an opening 31 and pass through the window 34 into engagement with one of the bolts 21. FIG. 11 also illustrates that the corner unit 20 may have locking studs 32 that are engagable in matching holes or recesses 36 in the guiding profiles 12 to prevent relative rotation of the corner unit 20 and the guiding profiles 12.

FIGS. 4 to 7 also illustrate how there may be provided interconnection elements extending between each guiding profile 12 and the reception profile 11 so as to prevent the guiding profiles 12 being fully displaced from the reception profile 11. In the illustrated example the interconnection element comprises a locking pin 23 that projects from the guiding profile 12 and is received in an elongate slot 24 formed in the reception profile 11. The locking pin 23 is able to move within the confines of the elongate slot 24 allowing a limited degree of relative movement between the guiding profile 12 and the reception profile 11.

Figure 8:
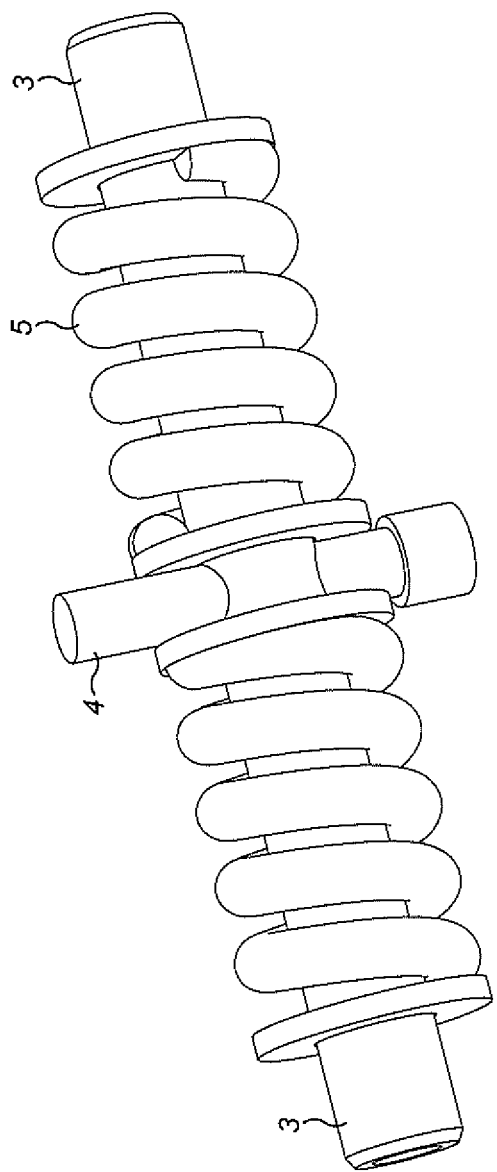
FIG. 8: perspective view illustrating parts of the tensioning device of the tensioning frame of FIG. 4.

FIG. 8 illustrates an enlarged view of the tensioning device which, in this example, comprises two springs 5 strung on the guiding pin 3. The fixing pin 4 is shown passing through the guiding pin 3. Washers may be provided, as shown, between each spring 5 and the fixing pin 4 and/or at the distal ends of the spring 5 remote from the fixing pin 4.

Figure 9:
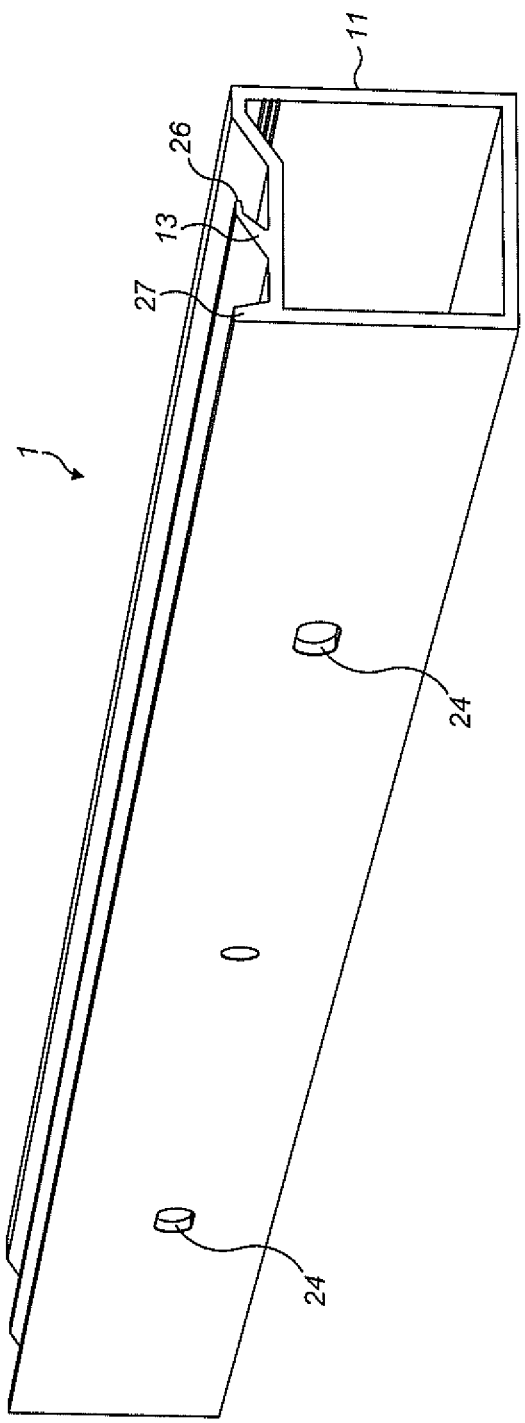
FIG. 9: perspective view illustrating another design of reception profile for use in tensioning frames of the present disclosure.
Figure 10:
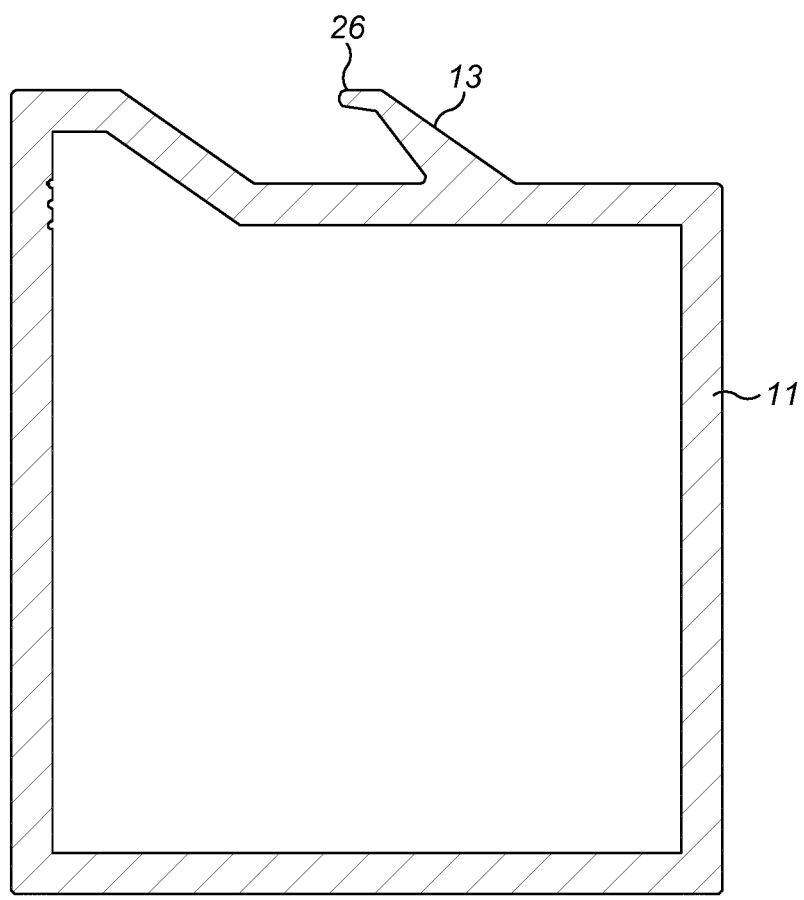
FIG. 10: cross sectional view illustrating a further design of reception profile for use in tensioning frames of the present disclosure.

FIGS. 9 and 10 illustrate two variants of designs for the cross-section of the reception profiles 11. In one variation the bent back profile of the fastening element 13 may comprise an angled tip 26 which is directed generally horizontally and parallel to a lower face of the edge element 1. In another variant, shown in FIG. 9, a levelling lip 27 may be provided on an inner edge of the reception profile 11 which can be used to provide support to the stencil foil when coupled to the fastening means 13 and may also assist is achieving a pre-determined offset of the stencil foil from a datum face of the edge element 1.

Figure 12:
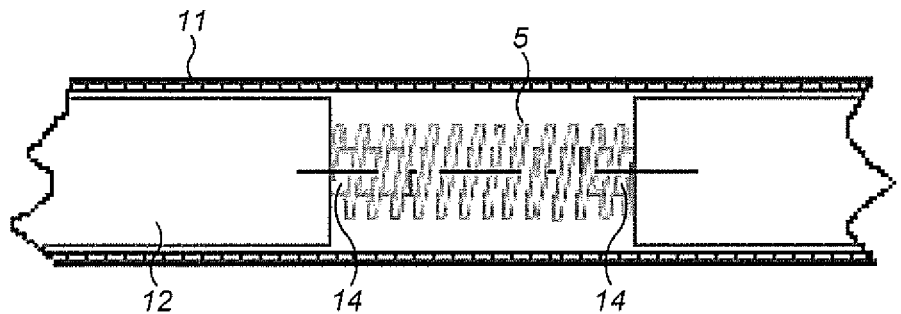
FIG. 12: side sectional schematic view of a simpler version of the tensioning device.

FIG. 12 shows an even simpler tensioning device in which the spring 5 is guided by two guiding elements 14 that are attached axially to the end of the guiding profiles 12. In assembled state it is important to leave a gap of 1-2 cm between the guiding elements 14, in order to have sufficient operational space. The task of guiding the springs 5 can be solved by different shaped constant cross section linear guidance elements (as tube or multiple bars), but even telescopic profiles can be used. The arrangement in the figure can further be simplified if the reception profile 11 (in which the tensioning device is seated) can guide from outside the spring 5, as this way even the guiding elements 14 can be omitted.

Figure 13:
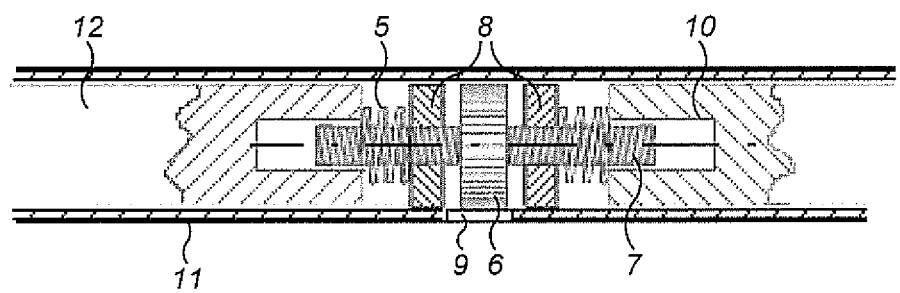
FIG. 13: side sectional view of one adjusting wheel type tensioning device.

FIG. 13 depicts an adjustable tension tensioning device with the axial section of the reception profile 11. Here we also find holes 10 at the end of the guiding profiles 12 but in this case threaded shafts 7 intrude into these holes at least partially. The threaded shafts 7 have the threads at their two ends and are firmly fixed to an adjustment wheel 6 in the middle. The adjustment wheel 6 can be a gear but at least has to be ribbed. On both sides of the adjustment wheel 6 on the threaded shaft 7 there is one threaded nut 8 that confine with the guiding profiles 12 the springs 5 on the threaded shaft 7. The thread of the threaded nuts 8 match up with the same side shaft thread and it is characteristic that their free rotation is prevented relative to the reception profile 11. The most straightforward way to achieve this is if the shape of the outside of the threaded nut 8 is similar to the inner section of the reception profile 11. The adjustable nature of the tensioning device lies in the principle that if through the opening 9 the adjustment wheel 6 is turned by e.g. a screwdriver then depending on the turning direction both side spring 5 pre-tensioning force will be reduced or increased. Thus the tensioning force can be regulated side-by-side. The tensioning of the foil through the springs 5 gives gentler and wider range adjustment potential for the frames.

Figure 14:
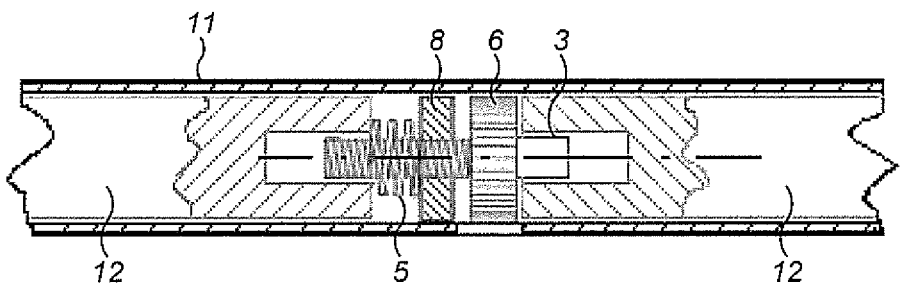
FIG. 14: side sectional view of another adjusting wheel type tensioning device.
Figure 15:
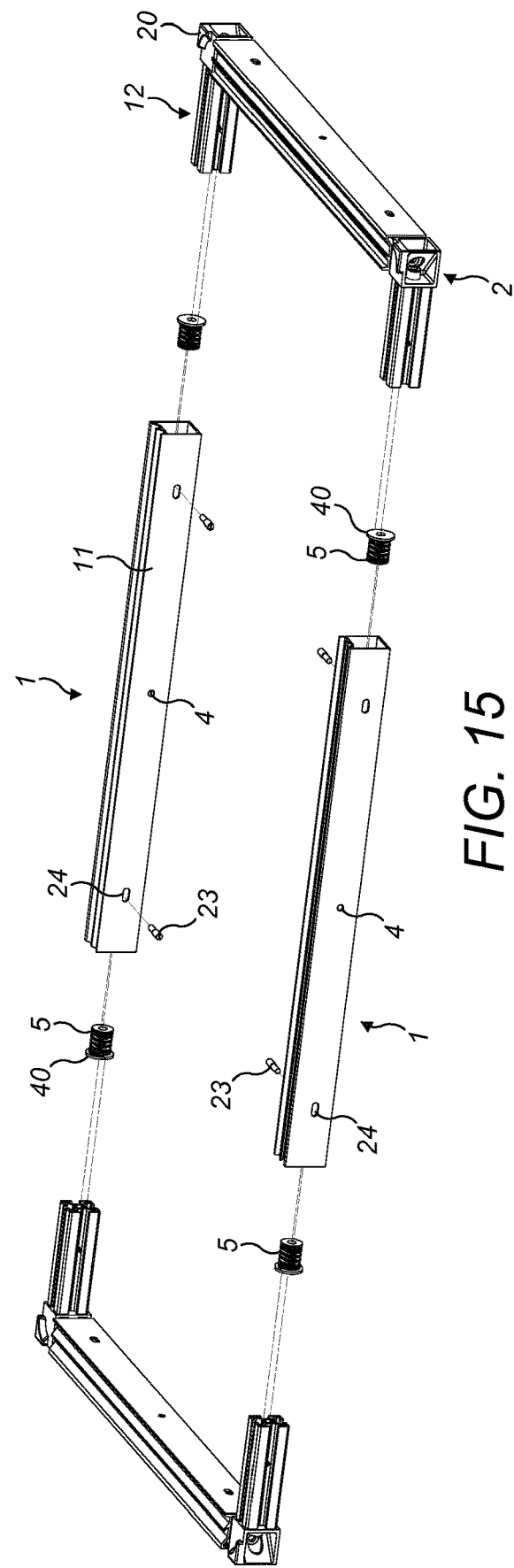
FIG. 15: exploded perspective view illustrating another tensioning frame according to the present disclosure.
Figure 16:
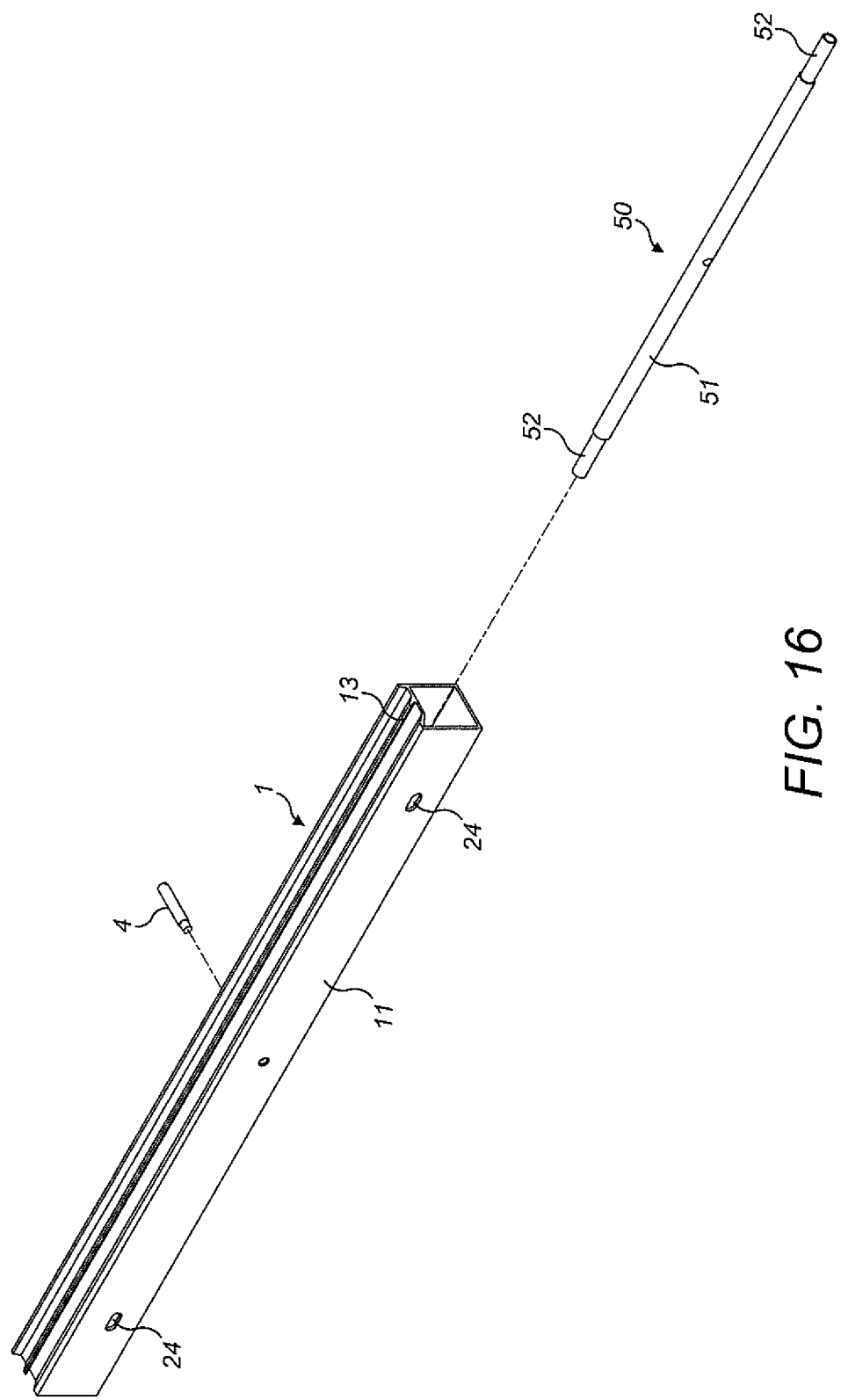
FIG. 16: exploded perspective view illustrating a sub-assembly of the tensioning frame of FIG. 15.
Figure 17:
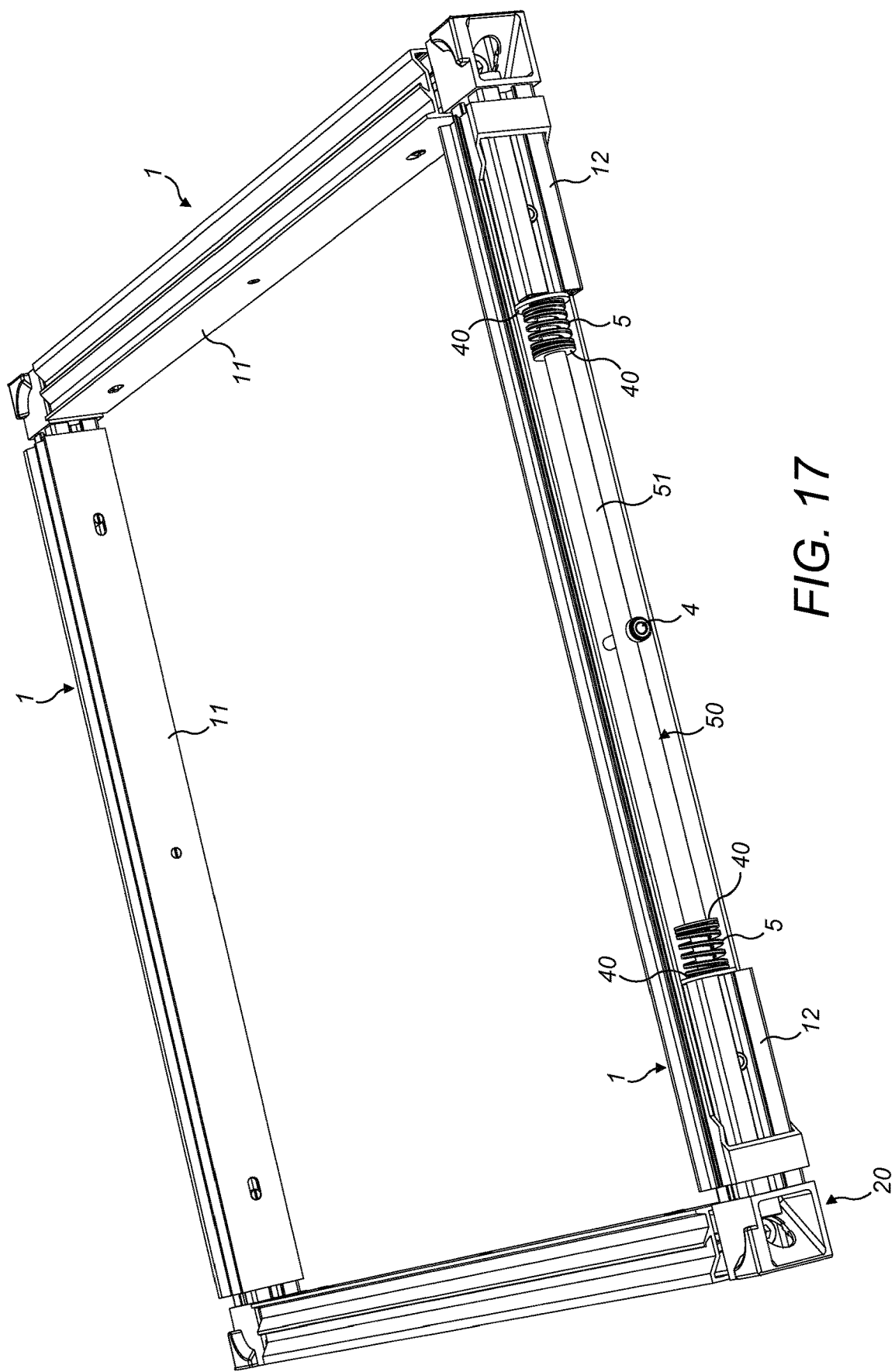
FIG. 17: perspective part-sectioned view of the tensioning frame of FIG. 15.

Stepping further to FIG. 14 we see a simpler version of the previous implementation. The thread on one side may totally be omitted and guiding pin 3 can be utilised on that side. The adjustment wheel 6 transmits the force from pre-tensioning the spring 5 to the reception profile 11 on this side. The rotation of the adjustment wheel 6 affects the rotationally locked threaded nut 8 in axial direction and thus increases or decreases the pre-tensioning of the spring 5.

FIGS. 15 to 18 illustrate another tensioning frame according to the present disclosure. The general working principal is the same as for the stencil frame of FIG. 3 with some modifications that will be described below. Like reference numerals have been used for like parts.

As shown, the tensioning device comprises a spacer element in the form of a spacer bar 50 and two springs 5. The spacer bar 50 comprise an enlarged diameter central section 51 and two narrowed diameter sections 52, one at each end. The use of the spacer bar 50 allows the springs 5 to be located apart from one another nearer the corner units 20. Consequently shorter guiding profiles 12 can be used than in the example shown in FIG. 4. The two springs 5 are strung over the narrowed diameter sections 52 at either end of the spacer bar 50. A washer 40 is interposed at each end of each spring 5 with one washer 40 abutting the guiding profile 12 and another washer 40 abutting the shoulder formed on the spacer bar at the junction between the enlarged diameter central section 51 and the narrowed diameter section 52. The spacer bar 50 may be connected to the reception profile 11 in which it is received by a perpendicular fixing pin or screw 4 that is fixed to the edge element 1 forming the reception profile 11.

INDUSTRIAL APPLICATION

The stencil frames of the present invention are useful for the tensioning of stencil foils and may be significantly cheaper and lighter than the state-of-the-art equipment. The stencil frames are also simpler to manufacture and use because no complicated actuation devices or pneumatic supplies are required. The stencil frames still preserves the practicality of possible adjustment of the tensioning force applied to the stencil foils.

The invention claimed is:
1. Stencil frame for tensioning stencils of an angular shape comprising corner elements, edge elements, fastening elements and tensioning devices with a tensioning device being associated with each edge element;
    the corner elements each have two, mutually perpendicular, guiding profiles, the two guiding profiles being joined at an intersection of their axes;

the edge elements each have a uniaxial reception profile, each reception profile being connectable to two guiding profiles by loose fit;
each tensioning device has at least one elastic element;
each tensioning device connects between two neighboring corner elements and each tensioning device is connected to one edge element;
wherein a line of force exerted by each tensioning device is parallel to the axis of its corresponding reception profile, and optionally the line of force exerted by each tensioning device is uniaxial with the axis of its corresponding reception profile.

2. Stencil frame as claimed in claim 1, wherein the or each guiding profile has a length of 10% to 45% of the length of the edge element in which it is received.

3. The stencil frame according to claim 2, wherein each guiding profile has a length of 10% to 25% of the length of the edge element in which it is received.

4. Stencil frame as claimed in claim 1, wherein the or each corner element comprises a corner unit provided in between the two guiding profiles with each guiding profile being coupled to the corner unit.

5. Stencil frame as claimed in claim 1, further comprising an interconnection element extending between the or each guiding profile and the reception profile in which it is received so as to prevent the guiding profiles being fully displaced from the reception profile when a stencil is not coupled to the stencil frame.

6. Stencil frame as claimed in claim 5, wherein the interconnection element allows a limited degree of relative sliding movement between the guiding profile and the reception profile.

7. Stencil frame as claimed in claim 1, wherein a low friction material or coating is applied to at least one of the guiding profile and reception profile.

8. Stencil frame as claimed in claim 1, wherein the guiding profiles and/or the reception profiles comprise closed box section tubes.

9. Stencil frame as claimed in claim 1, wherein the or each tensioning device is fully self-contained within an interior of the edge element.

10. Stencil frame as claimed in claim 1, wherein the or each tensioning device comprises one or more elastic elements.

11. Stencil frame as claimed in claim 10, wherein the elastic elements comprise springs and the springs are located so that when the stencil frame is not tensioned the force exerted by the springs is approximately zero.

12. Stencil frame as claimed in claim 10, wherein the elastic elements are guided by linear guidance elements that are attached axially to, or inserted within, or protrude from the ends of the respective guiding profiles.

13. Stencil frame as claimed in claim 1, wherein the or each tensioning device is connected to the edge element in which it is received.

14. Stencil frame as claimed in claim 1, wherein the or each tensioning device comprises an elastic element and at least a guiding pin, and each guiding profile has an axial hole on their end in which the guiding pin is loosely fitted, and the elastic element sits on the guiding pin and biases the neighboring corner elements apart.

15. Stencil frame as claimed in claim 1, wherein the or each tensioning device comprises at least of a tensioning spring, one threaded shaft, one threaded nut and a rotatable setting wheel fixed to the threaded shaft, and at least one of the connected corner elements has an axial hole at the end of the guiding profile in which the threaded shaft is fitted loosely, and the tensioning springs are mounted on the threaded shaft between the guiding profiles and the threaded nuts.

16. Stencil frame as claimed in claim 15, wherein the or each tensioning device comprises a spacer element and at least two elastic elements.

17. Stencil frame as claimed in claim 16, wherein the spacer element comprises a spacer bar, comprising an enlarged diameter central section and two narrowed diameter sections, one at each end, and the elastic elements are strung over each narrowed diameter section and abut against the enlarged diameter central section.

18. Stencil frame as claimed in claim 16, wherein the or each spacer element is connected to the reception profile in which it is received, by a perpendicular fixing pin or screw that is fixed to the edge element forming the reception profile.

19. Stencil frame as claimed in claim 1, wherein the or each fastening element comprises one or more of: a series of pins or splines aligned perpendicular to the edge element; a clamping rim alongside the edge element; a profile bent back; and a perpendicular shoulder along the edge element, and the fastening element is integrally formed with the edge element.

20. Stencil frame for tensioning stencils in an angular shape consisting of corner elements, edge elements fastening elements and tensioning devices in the number of edge elements, wherein the corner elements have two, mutually perpendicular, guiding profiles, the two guiding profiles are joined at the intersection of their axes, the edge elements have two uniaxial reception profiles, the reception profiles connect to the guiding profiles by loose fit, one tensioning device has at least one elastic element, each tensioning device connects to one edge element and two neighboring corner elements, and the line of force exerted by each tensioning device is parallel to the axis of the corresponding reception profile.

21. The stencil frame according to claim 20, wherein the guiding profiles and/or the reception profiles comprise square tubes.

22. The stencil frame according to claim 21, wherein the tensioning device consists of at least one spring, one threaded shaft, at least one threaded nut, and an adjustment wheel rotating together with threaded shaft, at least one of the connected corner elements have an axial hole at the end of its guiding profile, the threaded shaft fits into the holes with loose fit, the springs are strung on the threaded shaft between the threaded nuts and the guiding profiles, the threaded nuts are fitted to the inside walls of the edge element with a loose fit, the rotation of the threaded nuts around their axes is prevented by a key fit between the threaded nuts and the reception profiles, the reception profiles have at least one opening beside the adjustment wheel, the threaded nuts have opposite threads, and if there are two threaded nuts are on one threaded shaft, then one side of the threaded shaft has opposite thread direction relative to the other side.

23. The stencil frame according to claim 20, wherein the elastic element of the tensioning device is a spring, the spring is strung on a guiding pin, at the end of the guiding profiles of the corner elements connected to the tensioning device have an axial hole, and the guiding pin is attached to at least one of the holes with a loose fit.

24. The stencil frame according to claim 23, wherein perpendicular to the guiding pin there is a fixing pin, or fixing screw; the fixing pin, or fixing screw connects to the edge element.

25. The stencil frame according to claim 20, wherein the elastic element of the tensioning device is a spring, the springs are strung on linear guiding elements and the guiding elements protrude from the two neighboring uniaxial guiding profiles opposite to each-other.

26. The stencil frame according to claim 20, wherein the fastening element along the edge element is a series of pins or splines perpendicular to the edge element or is a clamping rim assembled alongside the edge element or is a bent shaped profile or perpendicular shoulder aligned alongside the edge element.

* * * * *